United States Patent
Hagimoto et al.

(10) Patent No.: US 11,114,817 B2
(45) Date of Patent: *Sep. 7, 2021

(54) SEMICONDUCTOR LASER DEVICE

(71) Applicant: USHIO DENKI KABUSHIKI KAISHA, Tokyo (JP)

(72) Inventors: Masato Hagimoto, Tokyo (JP); Hironori Yanagisawa, Tokyo (JP); Tomonobu Tsuchiya, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/936,178

(22) Filed: Mar. 26, 2018

(65) Prior Publication Data

US 2018/0278016 A1    Sep. 27, 2018

(30) Foreign Application Priority Data

Mar. 27, 2017  (JP) .............................. JP2017-061057
Aug. 29, 2017  (JP) .............................. JP2017-164096

(51) Int. Cl.
*H01S 5/024*       (2006.01)
*H01S 5/0237*      (2021.01)
*H01S 5/02212*     (2021.01)

(52) U.S. Cl.
CPC ........ *H01S 5/02476* (2013.01); *H01S 5/0237* (2021.01); *H01S 5/02469* (2013.01); *H01S 5/02212* (2013.01)

(58) Field of Classification Search
CPC .................................................. H01S 5/02476
See application file for complete search history.

(56) References Cited

U.S. PATENT DOCUMENTS 9,318,871 B2    4/2016  Sakata et al.
9,496,680 B2   11/2016  Sakata et al.
(Continued)

FOREIGN PATENT DOCUMENTS

DE    102014000510 A1 *  7/2015  .........  H01S 5/02476
JP    2007-081096     *  3/2007
(Continued)

OTHER PUBLICATIONS

An Office Action; "Notice of Reasons for Refusal", mailed by the Japanese Patent Office dated Mar. 9, 2021, which corresponds to Japanese Patent Application No. 2017-164096 and is related to U.S. Appl. No. 15/936,178; with English language translation.

*Primary Examiner* — Tod T Van Roy
(74) *Attorney, Agent, or Firm* — Studebaker & Brackett PC

(57) ABSTRACT

Disclosed herein is a semiconductor laser device utilizing a sub-mount substrate that is capable of having a further sufficient heat dissipation property. The semiconductor laser device comprises: a monocrystalline sub-mount substrate having a crystalline structure including a first crystalline plane (c-plane) having a normal line direction on a first crystalline axis (c-axis) and a second crystalline plane (a-plane) having a normal line direction on a second crystalline axis (a-axis) having a higher thermal conductivity than the first crystalline axis; and a semiconductor laser chip configured to be joined to a side of a first surface of the sub-mount substrate. The first crystalline plane inclines with respect to the first surface of the sub-mount substrate.

3 Claims, 5 Drawing Sheets

(56) References Cited

U.S. PATENT DOCUMENTS

| | | | | |
|---|---|---|---|---|
| 2008/0008641 | A1* | 1/2008 | Leonard | C30B 23/00 |
| | | | | 423/345 |
| 2010/0061914 | A1* | 3/2010 | Zwieback | C30B 35/00 |
| | | | | 423/345 |
| 2014/0321491 | A1* | 10/2014 | Sakata | H01S 5/02276 |
| | | | | 372/44.01 |
| 2017/0055365 | A1* | 2/2017 | Sanders | H01L 23/36 |

FOREIGN PATENT DOCUMENTS

| | | |
|---|---|---|
| JP | 2012-231067 A | 11/2012 |
| JP | 2013-018706 A | 1/2013 |
| JP | 2014-225660 A | 12/2014 |
| JP | 2015-054814 A | 3/2015 |

\* cited by examiner

SEMICONDUCTOR LASER DEVICE

FIELD OF THE INVENTION

The present invention relates to a semiconductor laser device that is provided with a sub-mount substrate.

DESCRIPTION OF THE RELATED ART

During operation, a semiconductor laser chip radiates laser light and also generates heat. In general, it is considered that the semiconductor laser chip demonstrates an improved output characteristic and reliability thereof at a low temperature. For this reason, it is of great importance to effectively dissipate the heat generated by the semiconductor laser chip. For dissipating heat, a heatsink is used that has a member constituted with a metal material having a high heat dissipation or radiation property (such as copper (Cu) or the like).

However, the heatsink constituted with the metal material having a high heat dissipation property has a higher linear expansion coefficient as compared to the semiconductor laser chip. For this reason, it is difficult to join the semiconductor laser chip directly to the heatsink. Accordingly, in general, the semiconductor laser chip is first joined to a sub-mount constituted with a material having a linear expansion coefficient of an intermediate value between the heatsink and the semiconductor laser chip, or alternatively of a value close to the semiconductor laser chip, and then the sub-mount is joined to the heatsink.

The sub-mount substrate is configured by selecting an appropriate material considering the linear expansion coefficient and the thermal conductivity. Typically, aluminum nitride (AlN) or silicon carbide (SiC) is used for the sub-mount substrate. For example, a Patent Literature 1 discloses that a monocrystalline or single crystal SiC, which is assumed to have a better heat dissipation property, is employed for the sub-mount of the semiconductor laser device.

LISTING OF REFERENCES

Patent Literatures

Patent Literature 1: Japanese Patent Application Laid-open Publication No. 2014-225660 A

SUMMARY OF THE INVENTION

Problems to be Solved by the Invention

In the meantime, recent years, the semiconductor laser device is desired to have a higher power output so that the sub-mount substrate is desired to further improve the heat dissipation property.

The present invention has been made in view of the above described circumstances and an object thereof is to provide a semiconductor laser device utilizing a sub-mount substrate that is capable of having a more sufficient heat dissipation property.

Solution to the Problem

In order to solve the above mentioned problems, according to one aspect of the present embodiments of the present invention, there is provided a semiconductor laser device. The semiconductor laser device comprises: a monocrystalline or single crystal sub-mount substrate having a crystalline structure including a first crystalline plane, which has a normal line direction thereof on a first crystalline axis, and a second crystalline plane, which has a normal line direction thereof on a second crystalline axis having a higher thermal conductivity than the first crystalline axis; and a semiconductor laser chip configured to be joined to a first surface side of the sub-mount substrate. The first crystalline plane inclines with respect to the first surface of the sub-mount substrate.

In this way, by employing a sub-mount substrate constituted with a material of which thermal conductivity has the anisotropy, the first crystalline axis and the second crystalline axis uniformly incline with respect to a normal line direction of the first surface, which is a surface at a side to which the semiconductor laser chip is joined. With the semiconductor laser device being so configured, it makes it possible to form a heat dissipation pathway (in other words, a thermal conduction pathway) of heat generated by the semiconductor laser chip in the direction close to the normal line direction of the first surface, as compared to the case in which the normal line direction of the first surface coincides with the direction of the first crystalline axis and an angle is 90 degrees between the normal line direction of the first surface and the direction of the second crystalline axis. In other words, by employing the crystalline axis having a higher thermal conductivity, it makes it possible to further improve the heat dissipation property in the normal line direction of the first surface of the sub-mount substrate. As a result, it makes it possible to effectively dissipate the heat generated by the semiconductor laser chip which is joined to the first surface side.

According to another aspect of the present embodiment, in the above described semiconductor laser device, the sub-mount substrate may be constituted with a monocrystal or single crystal made of any of silicon carbide (hereinafter referred to as "SiC"), gallium nitride (hereinafter referred to as "GaN"), and aluminum nitride (hereinafter referred to as "AlN"). With the sub-mount substrate being so configured, by employing a material having the anisotropy, in other words, having different thermal conductivities from one crystalline orientation to another, such as monocrystalline SiC, monocrystalline GaN, or monocrystalline AlN, it makes it possible to appropriately attain an effect that improves the heat dissipation property of the sub-mount substrate.

According to yet another aspect of the present embodiment, in the above described semiconductor laser device, the first crystalline plane may be a c-plane and the second crystalline plane may be an a-plane. In this case, it makes it possible to obtain the sub-mount substrate in which the c-plane inclines with respect to the first surface, which is a surface at a side to which the semiconductor laser chip is joined.

According to yet another aspect of the present embodiment, in the above described semiconductor laser device, an angle between the first surface of the sub-mount substrate and the first crystalline plane may be equal to or greater than 4 degrees and equal to or less than 20 degrees. By employing above described angle, it makes it possible to appropriately improve the heat dissipation property of the sub-mount substrate.

It should be noted that it can be assumed the heat dissipation property may be maximized by employing the sub-mount substrate in which, for example, the SiC single crystal is grown in the direction of the second crystalline plane. Nevertheless, such sub-mount substrate having a sufficient crystallinity has not yet realized, therefore is not readily available. In light of this fact, it is pragmatically achievable to set the angle between the first surface of the sub-mount substrate and the first crystalline plane to be within the above described range in the sub-mount substrate in which the SiC single crystal is grown in the first crystalline plane direction, as described above.

According to yet another aspect of the present embodiment, in the above described semiconductor laser device, the sub-mount substrate may have a second surface that is a surface at a side to which a heat radiating portion is joined, and the normal line direction of the first surface and the normal line direction of the second surface may coincide with each other. In this case, the thermal conductivity can be improved in the direction from the semiconductor laser chip toward the heatsink portion when the semiconductor laser chip is joined to one face of the sub-mount substrate (that is, a face at the first surface side) and the heat radiating portion such as the heatsink portion or the like is joined to the other face opposing to the above one face of the sub-mount substrate (that is, a face at the second surface side). As a result, it makes it possible to effectively dissipate the heat generated from the semiconductor laser chip through the heat radiating portion such as the heatsink portion or the like.

According to yet another aspect of the present embodiment, in the above mentioned semiconductor laser device, a rated power output of the semiconductor laser device may be equal to or greater than 1 W. In the semiconductor laser device having such a higher output, higher heat dissipation property is further necessitated. For this reason, when the above described sub-mount substrate is employed for the sub-mount, higher benefit can be obtained.

According to yet another aspect of the present embodiment, in the above mentioned semiconductor laser device, the number of micropipes per wafer (in a unit of wafer) in the sub-mount substrate may be equal to or less than 30/cm$^2$. With the sub-mount substrate being so configured, it makes it possible to obtain a sub-mount substrate having no, or substantially no, micropipes after being divided for the semiconductor laser chip.

Advantageous Effect of the Invention

According to the above mentioned aspects of the semiconductor laser device of the various embodiments, it makes it possible to obtain a semiconductor laser device utilizing a sub-mount substrate that is capable of having more sufficient heat dissipation property.

These and other objects, aspects and advantages of the present invention will become apparent to those skilled in the art from the following detailed description when read and understood in conjunction with the appended claims and drawings.

DETAILED DESCRIPTION OF THE INVENTION

Hereinafter, embodiments of the semiconductor laser device according to the present invention will be explained in detail with reference to accompanying drawings.

Figure 1:
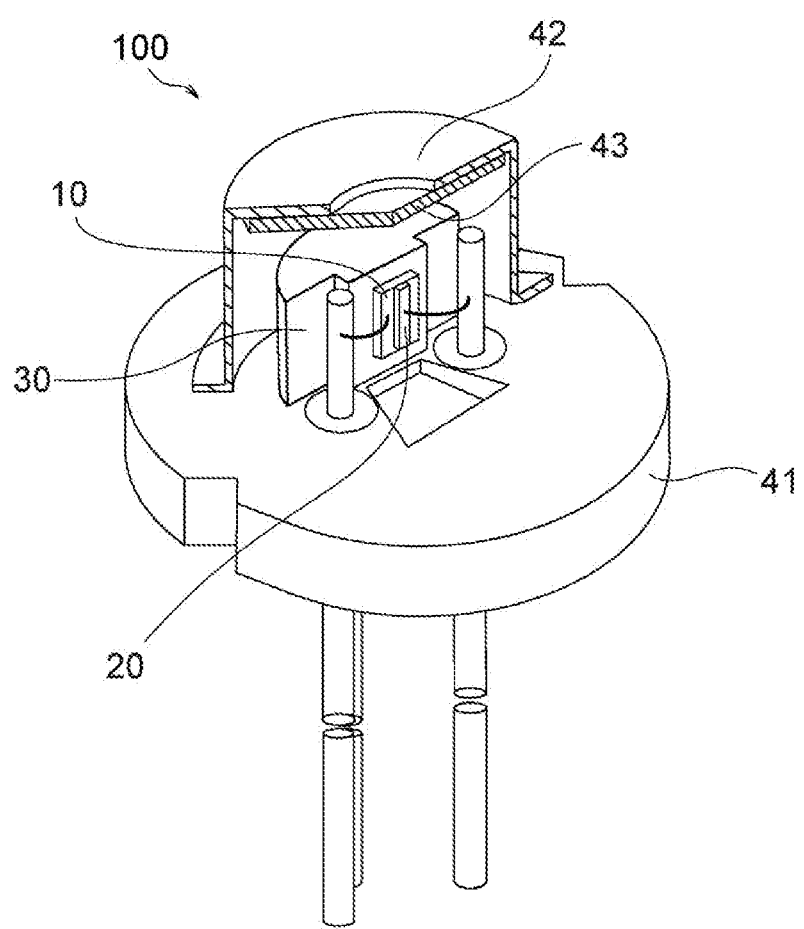
FIG. 1 is a perspective view illustrating an exemplary configuration of a semiconductor laser device according to the present embodiment of the present invention.

FIG. 1 is a perspective view illustrating an exemplary configuration of a semiconductor laser device 100 according to a present embodiment of the present invention. The semiconductor laser device 100 is provided with a sub-mount substrate 10, a semiconductor laser chip (hereinafter referred to as "LD chip") 20, and a heatsink portion (that is, a base portion) 30.

The sub-mount substrate 10 constitutes a sub-mount onto which a Laser Diode (hereinafter referred to as "LD") chip 20. Hereinafter in the present embodiment, a certain case in which the sub-mount substrate 10 is a silicon carbide (hereinafter referred to as "SiC") substrate made of a monocrystalline or single crystal SiC will be described. The SiC substrate may be a monocrystalline or single crystal SiC substrate (hereinafter also referred to as "monocrystalline SiC substrate") having an electrical conductivity, or alternatively may be a monocrystalline SiC substrate having an insulating property.

For example, an SiC substrate that contains impurities equal to or greater than $1*10^{14}/cm^3$ may be defined as an "electric conductive" SiC substrate, whereas an SiC substrate that contains impurities less than $1*10^{14}/cm^3$ may be defined as an "insulating" SiC substrate.

The LD chip 20 is, although not shown in the drawings, provided with a semiconductor layer. The semiconductor layer may be configured such that at least a first electric conductive semiconductor layer, an active layer, and a second electric conductive semiconductor layer are in turn layered in this order. For example, the above described substrate may be a substrate made of any of a GaAs-based material, an InP-based material, and a GaN-based material. The LD chip 20 is supplied with a prescribed injection current and emits laser light having a prescribed oscillation or emission wavelength. In this case, the LD chip 20 may have the rated power output equal to or greater than 1 W. It should be noted that the oscillation wavelength of the laser light is not limited to a specific wavelength.

A sub-mount onto which the LD chip 20 is mounted is joined to the heatsink portion 30. The heatsink portion 30 is arranged in a vicinity of a center portion on a circular surface of a stem 41 having a disc shape. The sub-mount is joined to the heatsink portion 30 such that, for example, an emission direction of the laser light emitted from the LD chip 20 coincides with a direction perpendicular to the circular surface of the stem 41. Also, in this case, the sub-mount may be joined to the heatsink portion 30 such that a light emitting point of the LD chip 20 is positioned in the center of the circular surface of the stem 41.

Yet also, the sub-mount configured to include the sub-mount substrate 10, the LD chip 20, and the heatsink portion 30 are covered by a cap 42 having a cylindrical shape together with surrounding lead pins and wires or the like. The cap 42 is mounted onto those components with the aim to protect the LD chip 20 or the wires or the like. A light extracting window 43 is provided at an opening formed in the center portion of an upper face of the cap 42. The laser light emitted from the LD chip 20 passes through the light extracting window 43 so as to exit outside the step 41.

The heatsink portion 30 is constituted with a metal material having a high heat dissipation property (for example, Cu or the like). Heat generated from the LD chip 20 when emitting is transferred, through the sub-mount configured to include the sub-mount substrate 10, to the heatsink portion 30 so as to be dissipated.

Figure 2:
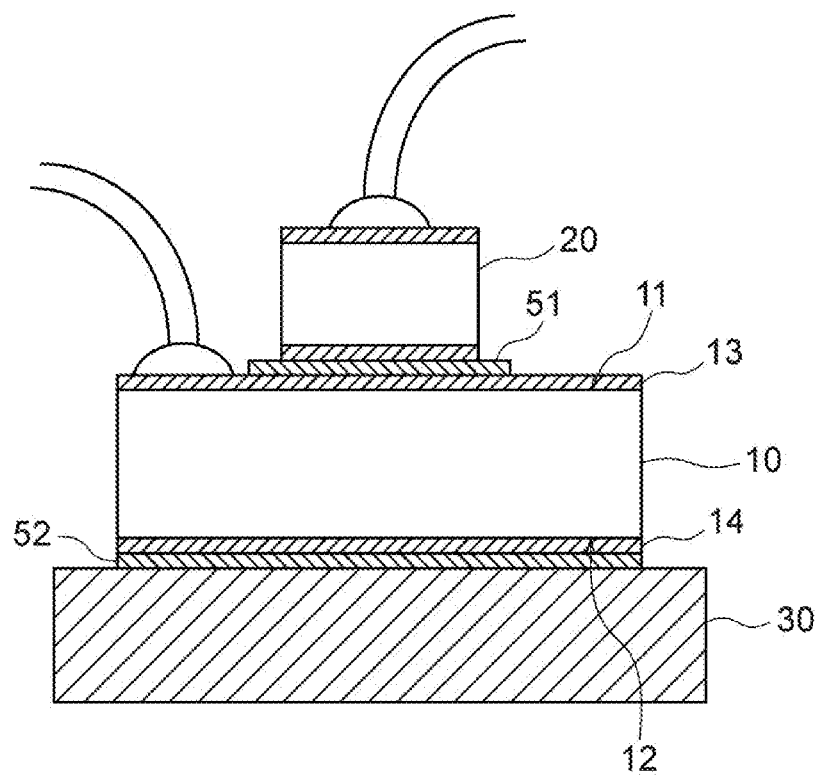
FIG. 2 is a cross sectional view illustrating an exemplary configuration of a sub-mount according to a present embodiment.

FIG. 2 is a cross sectional view illustrating an exemplary configuration of a sub-mount according to the present embodiment. FIG. 2 illustrates a joining portion of the sub-mount substrate 10, the LD chip 20, and the heatsink portion 30 in an enlarged manner.

The sub-mount substrate 10 includes a first surface 11 and a second surface 12 opposing to the first surface 11. The first surface 11 and the second surface 12 are arranged to be opposed to each other in the direction perpendicular to the emission direction of the laser light emitted from the LD chip 20. Hereinafter, according to the present embodiment, it is assumed that the normal line direction of the first surface 11 and the normal line direction of the second surface 12 coincide with each other.

A first electric conductive layer 13 is provided on the first surface 11 of the sub-mount substrate 10, and a second electric conductive layer 14 is provided on the second surface 12 of the sub-mount substrate 10. Here, the first electric conductive layer 13 and the second electric conductive layer 14 may be made of one or more materials selected from a group consisting of titanium (Ti), nickel (Ni), platinum (Pt), molybdenum (Mo), and silver or argentum (Au), respectively.

The LD chip 20 is joined onto the first electric conductive layer 13 through a joining (junction) layer 51. Likewise, the second electric conductive layer 14 is joined to the heatsink portion 30 through a joining layer 52. Here, the joining layer 51 and the joining layer 52 may be formed with the AuSn solder, respectively.

Also, according to the present embodiment, the thickness direction of the sub-mount substrate 10 (that is, the vertical direction in FIG. 2) uniformly inclines with respect to the crystalline axis or axes of the sub-mount substrate 10. The sub-mount substrate 10 has a crystalline structure that includes a c-axis, which is a first crystalline axis, and a-axes (that is, a1-axis, a2-axis, and a3-axis), any of which is a second crystalline axis having a higher thermal conductivity than the first crystalline axis. Here, when the sub-mount substrate 10 is constituted with a monocrystalline SiC substrate, the a-axis has the thermal conductivity of 490 W/m·K, whereas the c-axis has the thermal conductivity of 390 w/m·K.

Figure 3A:
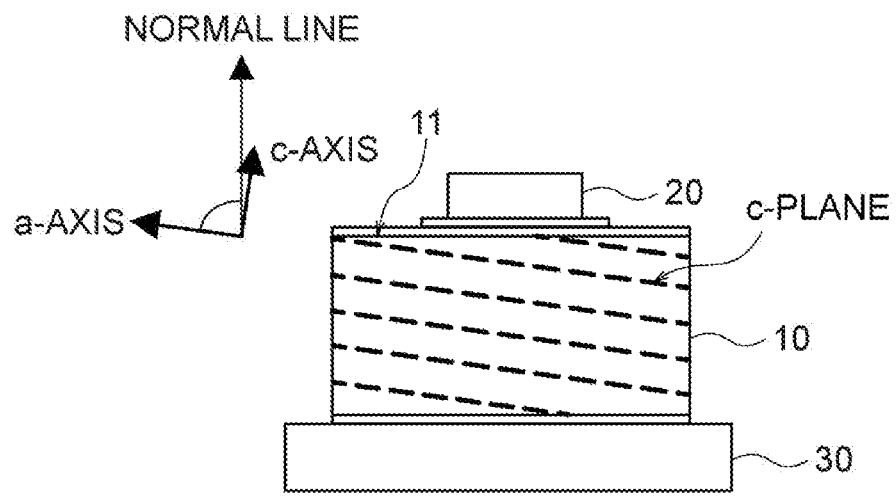
FIG. 3A is a view illustrating a direction of a crystalline axis of a sub-mount substrate according to the present embodiment.

As shown in FIG. 3A, the sub-mount substrate 10 according to the present invention has a structure in which the first crystalline plane (c-plane) inclines with respect to the first surface 11 of the sub-mount substrate 10. Hereinafter throughout the specification, a plane having a normal line direction on the first crystalline axis (c-axis) is referred to as a "first crystalline plane (c-plane)", and a plane having a normal line direction on the second crystalline axis (a-axis) is referred to as a "second crystalline plane (a-plane)". Also, hereinafter throughout the specification, a normal line direction of the first surface 11 of the sub-mount substrate 10 is referred to as a "substrate normal line direction".

Figure 3B:
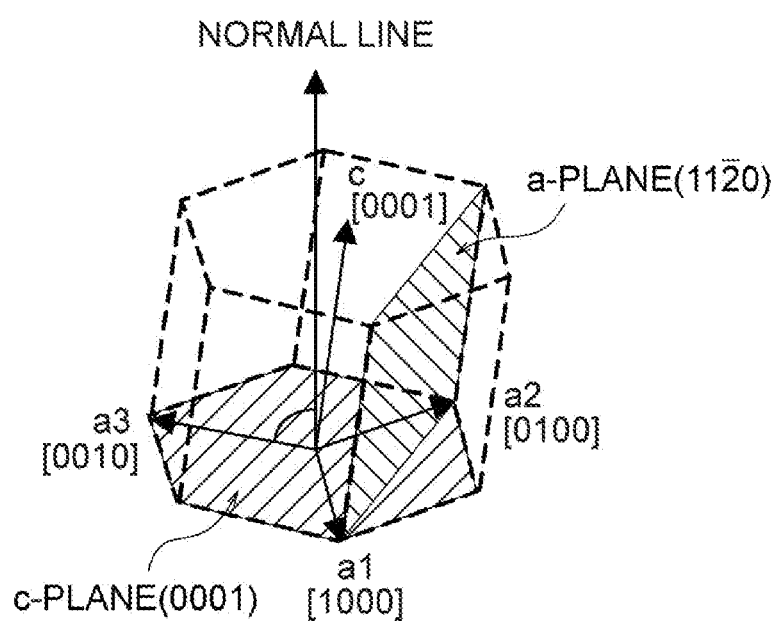
FIG. 3B is a view illustrating a direction of a crystalline axis of a sub-mount substrate according to the present embodiment.

In the case of the sub-mount substrate 10 employing the monocrystalline SiC having a crystalline structure of the hexagonal crystal system, as shown in FIG. 3B, the c-plane appearing to be perpendicular to the c-axis is set to incline with respect to the first surface of the sub-mount substrate 10. It should be noted that FIG. 3B illustrates an example in the case in which the a-axis in FIG. 3A is an a3-axis. Here, an angle between the first surface 11 and the first crystalline plane (c-plane) may be, for example, equal to or greater than 4 degrees and equal to or less than 20 degrees.

As described above, a single crystal of a certain material has different thermal conductivities from one crystalline orientation to another (that is, the thermal conductivity thereof has the anisotropy). For example, in the case of the SiC single crystal, as described above, the thermal conductivity of the a-axis is greater than the thermal conductivity of the c-axis, and therefore the heat dissipation property (that is, the thermal conductivity) in the a-axis direction is superior to the heat dissipation property in the c-axis direction. For this reason, by inclining the c-plane of the sub-mount substrate 10 with respect to the first surface 11 uniformly, it makes it possible to add the a-axis direction component, which has a higher thermal conductivity, to the substrate normal line direction. As a result, it makes it possible to improve the heat dissipation property in the substrate normal line direction as compared to the case in which the c-plane of the sub-mount substrate 10 is in parallel to the first surface 11 (that is, the case in which the c-axis direction coincides with the substrate normal line direction).

Figure 4A:
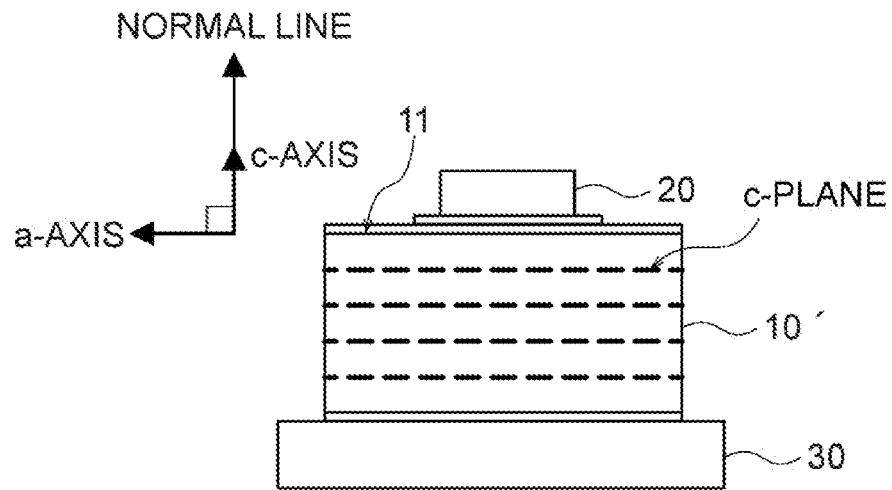
FIG. 4A is a view illustrating a direction of a crystalline axis of a sub-mount substrate according to a comparative example.
Figure 4B:
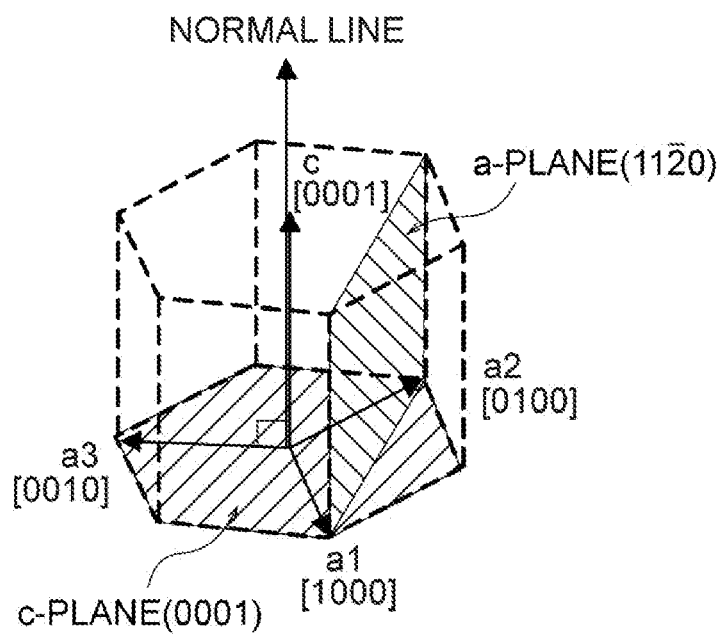
FIG. 4B is a view illustrating a direction of a crystalline axis of a sub-mount substrate according to a comparative example.

FIGS. 4A and 4B illustrate a sub-mount substrate 10' as a comparative example, respectively. The sub-mount 10' has a structure in which the first surface 11 of the sub-mount 10' is in parallel to the c-plane.

Figure 5A:
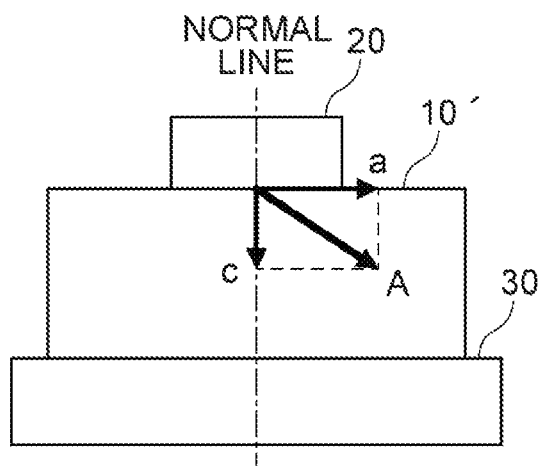
FIG. 5A is a view illustrating difference in a thermal conduction pathway between the present embodiment and the comparative example.

In the sub-mount 10' of the comparative example, as shown in an arrow A in FIG. 5A, the thermal conduction pathway of the heat generated from the LD chip 20 in the sub-mount substrate 10' becomes closer to the a-axis direction which has a higher thermal conductivity than in the c-axis direction.

On the other hand, the sub-mount 10 according to the present embodiment has a structure in which the first crystalline plane (c-plane) inclines with respect to the first surface 11. In this way, by inclining the c-plane of the sub-mount substrate 10 with respect to the first surface 11, as shown in an arrow B in FIG. 5B, it makes it possible to allow the thermal conduction pathway of the heat generated from the LD chip 20 in the sub-mount substrate 10 to be closer to the substrate normal line direction.

Figure 5B:
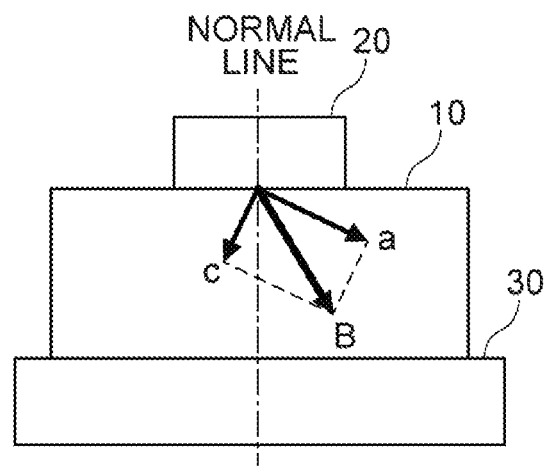
FIG. 5B is a view illustrating difference in a thermal conduction pathway between the present embodiment and the comparative example.

According to the semiconductor laser device 100 of the present embodiment, the normal line direction of the first surface 11, which is a side to which the LD chip 20 is joined, coincides with the normal line direction of the second surface 12, which is a side to which the heatsink portion 30 is joined. In other words, the LD chip 20 and the heatsink portion 30 are arranged to be opposed to each other in the substrate normal line direction. For this reason, the shortest thermal conduction pathway from the LD chip 20 to the heatsink portion 30 is assumed to be a pathway in the normal line direction of the first surface 11 and the second surface 12, that is, in the substrate normal line direction. As a result, as shown in FIG. 5B, by allowing the thermal conduction pathway of the heat generated by the LD chip 20 to be closer to the substrate normal line direction, it makes it possible to improve the heat dissipation property through the heatsink portion 30.

As described above, the sub-mount substrate 10 according to the present embodiment has a structure in which the c-plane dares to incline with respect to the first surface 11 serving as the substrate surface in order to improve the heat dissipation property of the heat generated from the LD chip 20 through the heatsink portion 30. In this way, by utilizing the anisotropy in the thermal conductivity, it makes it possible to attain the further improvement in the heat dissipation property in the substrate normal line direction of the sub-mount substrate 10. As a result, it makes it possible to effectively radiate or release the heat generated from the LD chip 20 when emitting to the heatsink portion 30 which is arranged to be opposed to the LD chip 20 in the substrate normal line direction.

In addition, in order to enhance an effect of the improved heat dissipation property in the substrate normal line direction of the sub-mount substrate 10, preferably, an angle between the first surface 11 and the first crystalline plane (c-plane) is equal to or greater than 4 degrees. Also, as the angle between the first surface 11 and the first crystalline plane (c-plane) direction becomes closer to 90 degrees, an angle between the substrate normal line direction and the second crystalline axis (that is, any one of a1-axis, a2-axis, and a3-axis) becomes closer to 0 degrees. For this reason, although the effect in the improved heat dissipation property is enhanced in the substrate normal line direction, due to the constraint in manufacturing the sub-mount substrate or the like, the angle between the first surface 11 and the first crystalline plane (c-plane) direction may be equal to or less than 20 degrees.

It should be noted that, although it is assumed that the heat dissipation property may be maximized when employing the sub-mount substrate in which the SiC single crystal is grown on the second crystalline plane (a-plane), such sub-mount substrate having a sufficient crystallinity or crystalizability has not yet realized. Thus, in reality, such a substrate with high quality is not readily available. For this reason, it is considered to be pragmatic to set the angle between the first surface 11 of the sub-mount substrate 10 and the first crystalline plane (c-plane) to be within the range between the 4 degrees and 20 degrees, as described above, in the sub-mount substrate in which the SiC single crystal is grown on the first crystalline plane (c-plane).

Also, in order to increase the thermal conductivity of the sub-mount substrate, it is preferable that the number of defects in a hollow pipe shape, which is referred to as "micropipes", is smaller. According to the present embodiment, the number of the micropipes per wafer (in a unit of wafer) in the sub-mount substrate is equal to or less than 30/cm$^2$ or 10/cm$^2$, preferably 5/cm$^2$, and more preferably 1/cm$^2$. After divided for the semiconductor laser chip, within the sub-mount for the semiconductor laser element, it is preferable that the number of the micropipes is substantially zero (zero or approximately zero). In this way, by employing the sub-mount substrate having substantially zero micropipes, it makes it possible to effectively enhance the thermal conductivity of the sub-mount substrate so as to increase the heat dissipation property.

In addition, when the monocrystalline or single crystal SiC substrate constituting the sub-mount substrate 10 is electric conductive, in order to assure the insulating property of the sub-mount substrate 10, it is preferable to provide an insulating film insulating the first electric conductive laser 13 from the second electric conductive layer 14. A position at which the insulating film is disposed may be on at least one of the first surface 11 and the second surface 12 of the sub-mount substrate 10. The insulating film may be made of aluminum nitride (AlN). It should be noted that a material or the film thickness of the insulating film may be set as appropriate. Also, the insulating film may have the film thickness, for example, equal to or greater than 0.2 μm and equal to or less than 10 μm.

Figure 6:
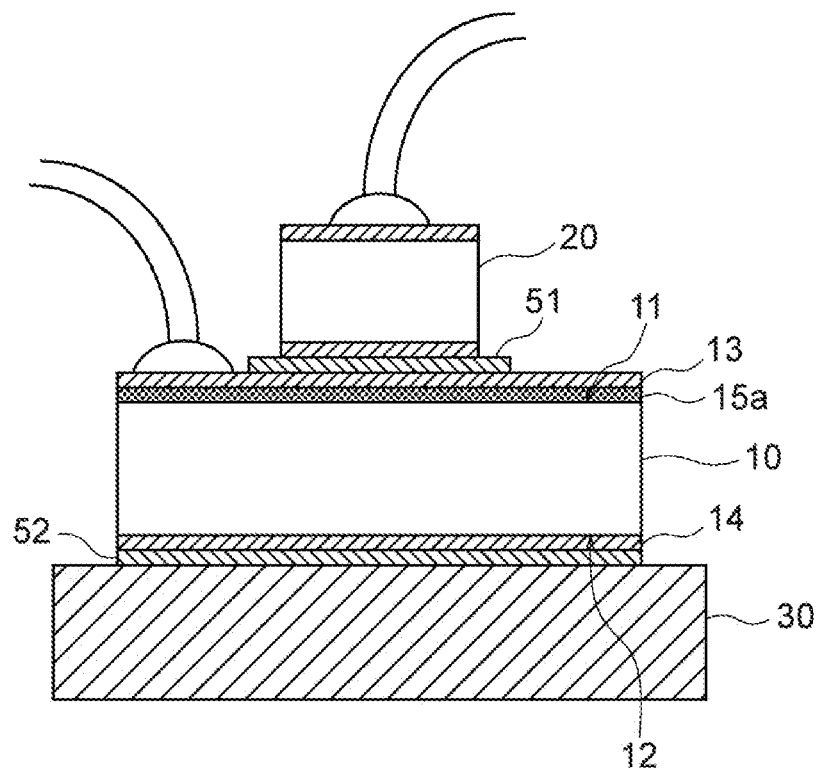
FIG. 6 is a cross sectional view illustrating an exemplary configuration of a sub-mount provided with an insulating film.

FIG. 6 is a view illustrating an exemplary configuration of a sub-mount in which the insulating film 15a is provided on the first surface 11 of the sub-mount substrate 10 which is a monocrystalline or single crystal SiC substrate having the electrical conductivity.

As shown in FIG. 6, by providing the insulating film 15a on the first surface 11 of the sub-mount substrate 10 (hereinafter referred to as "SiC substrate 10"), it makes it possible to prevent the short circuit between the first electric conductive layer 13 and the second electric conductive layer 14, both of which are provided on a front face of the SiC substrate 10 (that is, a face at the first surface 11 side) and on a rear face thereof (that is, a face at the second surface 12 side), respectively. In other words, although the SiC substrate 10 itself is an electrically conducive substrate, it makes it possible to appropriately insulate a conductive member to be joined to the first surface 11 side of the SiC substrate 10 (that is, the first electric conductive layer 13 and the LD chip 20) from another conductive member to be joined to the second surface 13 side of the SiC substrate 10 (that is, the second electric conductive layer 14 and the heatsink portion 30).

When employing the monocrystalline or single crystal SiC substrate having the insulating property, since a large number of micropipes exist therein, a conductive member such as a solder material is likely to creep into the micropipes so that the insulating property of the monocrystalline SiC substrate is likely to be lowered. In order to prevent the conductive member from creeping into the micropipes, a certain method is conceivable that performs a process of sealing or closing the micropipes with the insulating material. However, such process is complicated.

On the other hand, by employing a configuration in which the insulating film 15a is provided on the first surface 11 of the SiC substrate 10 to assure the insulating property, the above mentioned complicated process may be eliminated for, for example, sealing or closing the micropipes with the insulating material.

In addition, as described above, since the SiC substrate 10 contains extremely small amount of micropipes, an amount of an electrode material creeping or getting into the micropipes is also extremely small. Therefore, when the utmost film thickness of the insulating layer 15a, which is originally formed on the SiC substrate 10, is equal to or less than 4 μm, a sufficient insulating property can be assured. In this case, the time necessitated for forming the insulating film may be reduced, and it makes it possible to suppress the heat dissipation property associated with forming the insulating film 15a from decreasing to the minimum. As a result, it is preferable for the film thickness of the insulating film 15a to be, in particular, equal to or less than 4 μm.

In addition, since the SiC substrate 10 has no, or substantially no, micropipes, the insulating film 15a is unlikely to be buried into the micropipes. For this reason, the surface of the insulating film 15a is unlikely to rise and fall (roll), and therefore it can eliminate a polishing process for flattening the surface of the insulating film 15a. As a result, it makes it possible to simplify the manufacturing process of the sub-mount substrate.

As described above, in the monocrystalline or single crystal SiC substrate having the electrical conductivity, it makes it possible to assure the insulating property while utilizing an advantage of superior or sufficient heat dissipation property and inexpensiveness. As a result, it makes it possible to attain the semiconductor laser device 100 utilizing the monocrystalline SiC substrate that is capable of assuring both the sufficient heat dissipation property and the insulating property.

Yet in addition, the rated power output of the LD chip 20 can be equal to or greater than 1 W. In such a LD chip 20 having a higher output, higher heat dissipation property is further necessitated. Accordingly, higher benefit can be obtained by employing the SiC substrate according to the present embodiment for the sub-mount.

Modification to Embodiments

Although in the above described embodiments, a certain case has been described in which the sub-mount substrate 10 is constituted with the SiC single crystal, the present embodiment is not limited to those material and may employ any material of which thermal conductivity has the anisotropy. For example, a single crystal of GaN or AlN may be employed instead.

Yet also, although in the above described embodiments, a certain case of the can (canned package) type semiconductor laser device 100 has been described. Nevertheless, a semiconductor laser device to which the present invention is applicable it not limited to the can type device.

While certain embodiments have been described, these embodiments have been presented by way of example only, and are not intended to limit the scope of the present invention. The novel devices, apparatuses and methods thereof described herein may be embodied in a variety of other forms. Furthermore, various omissions, substitutions, modifications and changes in the form of the devices, apparatuses and methods thereof described herein may be made without departing from the gist of the present invention. The accompanying claims and their equivalents are intended to cover such forms of modifications as would fall within the scope and gist of the present invention.

The present application is based upon and claims the benefit of a priority from Japanese Patent Application No. 2017-61057, filed on Mar. 27, 2017 and Japanese Patent Application No. 2017-164096, filed on Aug. 29, 2017, and the entire content of those Japanese Patent Applications is incorporated herein by reference.

REFERENCE SIGNS LIST

100: Semiconductor Laser Device
10: Silicon Carbide (SiC) Substrate
11: First Surface
12: Second Surface
13: First Electric Conductive Layer
14: Second Electric Conductive Layer
20: Semiconductor Laser Chip (LD Chip)
30: Heatsink Portion
51; 52: Joining Layer

What is claimed is:

1. A semiconductor laser device, comprising:
a monocrystalline electrically conductive GaN sub-mount substrate having a crystalline structure including a first crystalline plane and a second crystalline plane, the first crystalline plane being a c-plane and having a normal line direction thereof on a first crystalline axis and the second crystalline plane being an a-plane and having a normal line direction thereof on a second crystalline axis having a higher thermal conductivity than the first crystalline axis;
a semiconductor laser chip configured to be joined to a side of a first surface of the sub-mount substrate;
a first joining layer configured to join the semiconductor laser chip to the first surface of the sub-mount substrate;
a second joining layer configured to join a second surface of the sub-mount substrate to a heatsink; and
an insulating film having a thickness less than 10 um and greater than or equal to 0.2 um and configured to insulate the semiconductor laser chip from the heatsink, and
the first surface of the sub-mount substrate being offset from the first crystalline plane at an angle between 4 degrees and 20 degrees so as to add a component in a direction of the second crystalline axis which has a higher thermal conductivity as compared to a line normal to the first surface of the sub-mount substrate.

2. The semiconductor laser device according to claim 1, wherein
a normal line direction of the first surface and a normal line direction of the second surface coincide with each other.

3. The semiconductor laser device according to claim 1, wherein the semiconductor laser chip has a rated power output equal to or greater than 1 W.

* * * * *